United States Patent
Blyth et al.

(10) Patent No.: US 12,549,173 B2
(45) Date of Patent: Feb. 10, 2026

(54) CURRENT MONITORING IN SWITCHED MODE DRIVERS

(71) Applicant: Cirrus Logic International Semiconductor Ltd., Edinburgh (GB)

(72) Inventors: Malcolm Blyth, Edinburgh (GB); Ross C. Morgan, Bathgate (GB); Michael Robinson, Edinburgh (GB)

(73) Assignee: Cirrus Logic Inc., Austin, TX (US)

( * ) Notice: Subject to any disclaimer, the term of this patent is extended or adjusted under 35 U.S.C. 154(b) by 171 days.

(21) Appl. No.: 18/364,027

(22) Filed: Aug. 2, 2023

(65) Prior Publication Data

US 2025/0047275 A1 Feb. 6, 2025

(51) Int. Cl.
*H03K 17/082* (2006.01)
*H04R 3/00* (2006.01)
*H04R 29/00* (2006.01)

(52) U.S. Cl.
CPC ........... *H03K 17/0822* (2013.01); *H04R 3/00* (2013.01); *H04R 29/001* (2013.01)

(58) Field of Classification Search
CPC ..... H03K 17/0822; H04R 3/00; H04R 29/001
See application file for complete search history.

(56) References Cited

U.S. PATENT DOCUMENTS 5,781,067 A * 7/1998 Tota .................. H03F 3/2171
330/10

\* cited by examiner

*Primary Examiner* — Andrew Sniezek
(74) *Attorney, Agent, or Firm* — Jackson Walker L.L.P.

(57) ABSTRACT

This application relates to methods and apparatus for current monitoring in switched mode drivers. A switching driver has an output stage with a network of switches for switching an output node between different switching voltages and a modulator for controlling a duty-cycle of the switching output stage based on the input signal, where the modulator generates a modulator signal based on the input signal. A current monitor is configured to receive a first current signal indicative of a sensed first driver current and to determine and/or limit a second driver current using the first current signal and the modulator signal. One of the first driver current and the second driver current is an output current to the load and the other of the first driver current and the second driver current is an input current from a power supply.

20 Claims, 4 Drawing Sheets

CURRENT MONITORING IN SWITCHED MODE DRIVERS

FIELD OF DISCLOSURE

The field of representative embodiments of this disclosure relates to methods, apparatus and/or implementations concerning or relating to current monitoring for driver circuits, and in particular to monitoring input current for switched mode driver or amplifier circuits or switching drivers with capacitive voltage generation as may be used to drive a transducer.

BACKGROUND

Many electronic devices include transducer driver circuitry for driving a transducer with a suitable driving signal, for instance for driving an audio output transducer of the host device or a connected accessory, with an audio driving signal.

In some applications the driver circuitry may include a switching driver, e.g. a class-D amplifier output stage or the like, for generating the driving signal. Switching drivers, sometimes referred to as switched-mode drivers or switched-mode amplifiers, can be relatively power efficient and thus can be advantageously used in some applications. A switching driver generally operates to switch an output node between different switching voltages, with a duty cycle that provides a desired average output voltage, over the course of one or more switching cycles, for the drive signal.

In some cases, the switching driver may operate to receive defined supply voltages and switch the output node(s) between the received supply voltages. In some implementations, however, the switching driver may include some circuitry for generating additional or alternative voltages to be used as switching voltages, for instance inductor-based voltage boosting where a boosted voltage can be generated from the supply voltages and used, at least in some driver modes of operation, as a switching voltage. Recently, switching drivers have been proposed that use capacitive voltage generation to provide additional or alternative switching voltages, e.g. generated using a flying capacitor such as via a charge pump or the like.

In general, it may be desirable to be able to monitor the input current to the switching driver, e.g. for current limiting purposes to limit a high input current to prevent damage to components and/or to implement other control functions. The monitoring of the input current should therefore, preferably, be performed with a relatively low latency so as to be able to respond to relatively rapid changes in current.

Typically, monitoring input current to an amplifier or driver may be performed by sensing the voltage drop across a resistance, e.g. a sense resistor, in the input current path using a suitable analogue front end (AFE), typically with an analog-to-digital converter (ADC). Such an arrangement can, in many implementations, provide suitable current monitoring. However, the AFE and ADC can be relatively large in terms of circuit area and, in general, there is a trend to smaller circuit footprints, where possible, for size and cost reasons. Also, for switching drivers with capacitive voltage generation, there may be a variety of possible input paths for current, which may require the use of multiple sense resistors, which can lead to relatively complex monitoring arrangements.

Further, in some applications the switching driver may be part of a multi-channel driver apparatus for driving different load transducers in different channels, e.g. for stereo or multi-channel audio, and at least some of the components of the switching driver may be shared with a switching driver of another channel, which can lead to complications in determining the relevant input current for each channel.

SUMMARY

Embodiments of the present disclosure relate to methods and apparatus for current monitoring that at least mitigate at least some of the above-mentioned issues.

According to an aspect of the disclosure there is provided a driver apparatus for driving a load with an output signal based on an input signal. The driver apparatus has a switching driver comprising an output stage having a network of switches for switching at least a first output node between different switching voltages with a controlled duty-cycle to generate the output signal and a modulator for controlling the duty-cycle of the output stage based on the input signal, wherein the modulator generates a modulator signal based on the input signal. A current monitor is configured to receive a first current signal indicative of a sensed first driver current and to determine and/or limit a second driver current using the first current signal and the modulator signal, wherein one of the first driver current and the second driver current is an output current to the load and the other of the first driver current and the second driver current is an input current from a power supply.

In some examples, the modulator may comprise a quantizer controller configured to generate switch control signals for the network of switches of the output stage and the quantizer controller may be configured to receive a quantizer input signal based on the input signal combined with a feedback signal indicative of the output signal. The quantizer input signal may be the modulator signal.

In some examples, the switching driver may be operable in a plurality of different driver modes, wherein the switching voltages are different in the different driver modes, and the quantizer may be configured to generate the switch control signals for the network of switches of the output stage to also control the driver mode based on the quantizer input signal.

In some examples, the current monitor may be configured to limit the second driver current to not exceed a current limit value. The driver apparatus may comprise a limiter for limiting the quantizer input signal to not exceed a modulator signal limit wherein the current monitor may be configured to generate the modulator signal limit as a function of the first current signal and the current limit value. The limiter may comprise a limiter controller for determining when to apply limiting to the quantizer input signal, wherein the controller may be configured to determine when to apply limiting based on filtered version of the quantizer input signal.

In some cases, the first driver current may be the output current to the load and the second driver current may be the input current from a power supply. In which case, the current monitor may be configured to generate the modulator signal limit by dividing the current limit value by the first current signal. The current monitor may be configured such that the modulator signal limit varies with changes in the first current signal more quickly when limiting is not being applied to the quantizer input signal than when limiting is being applied. In some examples, the current monitor may be configured to determine a target value of the modulator signal limit based on the first current signal and to update a present value of the modulator signal limit to a new value of the modulator signal limit as a weighted sum of the present value and the target value with respective complementary weightings. The current monitor may be configured to vary the respective complementary weightings based on a difference between the target value of the modulator signal limit and a previously determined target value of the modulator signal limit.

In some cases, the first driver current may be the input current from a power supply and the second driver current may be the output current to the load. In which case, the current monitor may be configured to generate the modulator signal limit by dividing the first current signal by the current limit value.

In some examples, the current monitor may be configured to controllably vary the current limit value to apply transient current control.

In some examples, the current monitor may be configured to determine a value indicative of the second driver current and to output the determined value indicative of the second driver current as a second current signal. In case when the first driver current is the output current to the load and the second driver current is the input current from a power supply, the current monitor may be configured to determine the value indicative of the second driver current by multiplying the first current signal by the modulator signal. The current monitor may be further configured to limit the second driver current to not exceed a current limit value by limiting the modulator signal to not exceed a modulator signal limit that is generated as a function of the first current signal and the current limit value.

The current monitor may be configured to output the current limit value as the value of the second current signal when limiting is being applied to the internal modulator signal. In cases where the first driver current is the input current from a power supply and the second driver current is the output current to the load, the current monitor may be configured to determine the value indicative of the second driver current by dividing the first current signal by the modulator signal.

In some examples, the switching driver may comprise at least one capacitive voltage generator for generating at least one voltage that can be used as a switching voltage.

The driver apparatus may be implemented as an audio driving apparatus for driving an audio transducer with an audio output signal.

In another aspect, there is provided a driver apparatus for driving a load with an output signal based on an input signal comprising a switching driver having an output stage for switching at least a first output node between different switching voltages with a controlled duty-cycle to generate the output signal and a modulator for controlling the duty-cycle of the output stage based on the input signal. A current monitor is configured to receive an indication of a sensed first current and to determine at least one of: an indication of a value of a second current, wherein the indication of the value of the second current is determined as a function of the indication of the sensed first switching driver current and a modulator signal received from the modulator; and a modulator signal limit for limiting the modulator signal so as to apply current limiting of the second current, wherein the modulator signal limit is determined as a function of the indication of the sensed first current and a current limit value. One of the first and second currents is an output current from the output stage to the load and the other of the first and second currents is an input current to the switching driver from a power supply.

In a yet further aspect there is provided a driver apparatus for driving a load with an output signal based on an input signal having a switching driver comprising an output stage having a network of switches for switching at least a first output node between different switching voltages with a controlled duty-cycle to generate said output signal; and a modulator for generating switch control signals for controlling the network of switches to control the duty-cycle of the switching output stage. The modulator comprises a filter arrangement configured to generate a modulator signal based on the input signal and a feedback signal of the output voltage and a quantizer configured to generate the switch controls signals based on the modulator signal. The driver apparatus also comprises a current limiter for limiting an input current of the switching driver not to exceed an input current limit, wherein the current limiter is configured to generate a modulator signal limit as a function of the current limit value and a received signal of a sensed output current and to limit the modulator signal not to exceed the modulator signal limit.

It should be noted that, unless expressly indicated to the contrary herein or otherwise clearly incompatible, then any feature described herein may be implemented in combination with any one or more other described features.

BRIEF DESCRIPTION OF THE DRAWINGS

For a better understanding of examples of the present disclosure, and to show more clearly how the examples may be carried into effect, reference will now be made, by way of example only, to the following drawings in which.

DETAILED DESCRIPTION

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiments discussed below, and all such equivalents should be deemed as being encompassed by the present disclosure.

Embodiments of the disclosure relate to current monitoring for switching drivers, e.g. switched mode amplifiers such as class-D amplifiers or the like, and in particular for current monitoring, especially input current monitoring, for switching drivers operable with capacitive voltage generation.

Figure 1:
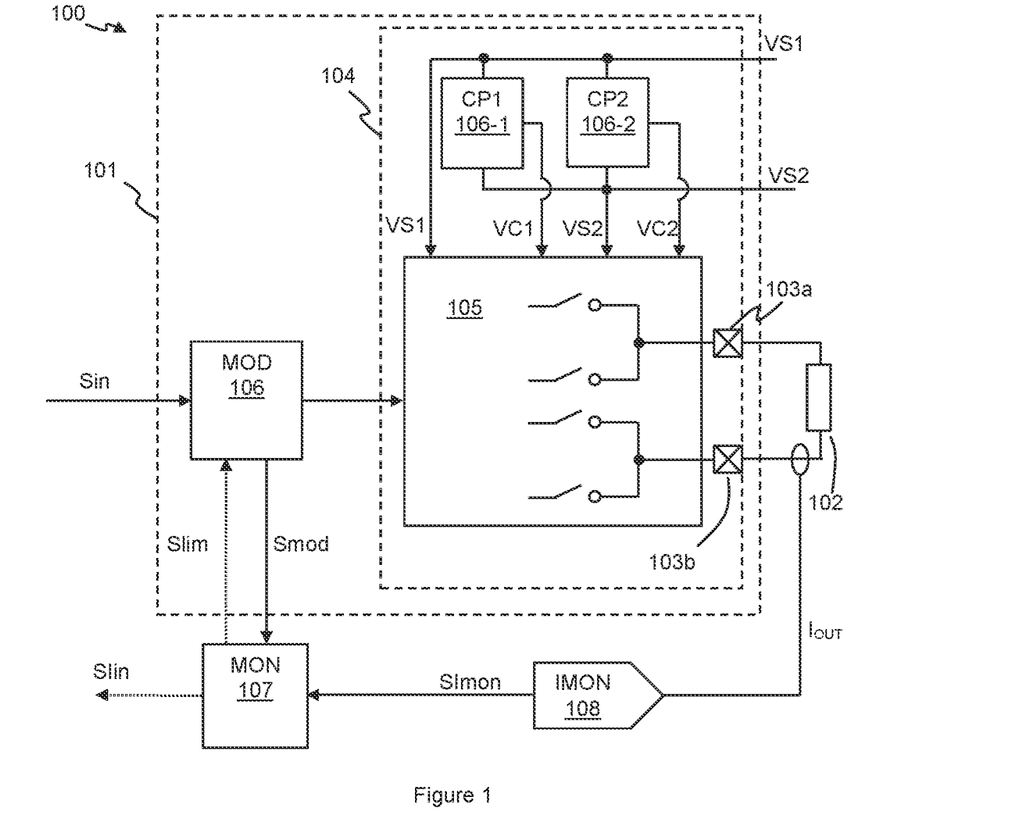
FIG. 1 illustrates one example of a switching driver apparatus with input current monitoring.

FIG. 1 illustrates one example of a driver apparatus 100 having a switching driver 101 for driving a transducer load 102 based on an input signal Sin. In some applications the transducer load 102 could be an audio or acoustic output transducer, such as a loudspeaker of a host device of the driver apparatus or a speaker of an accessory device which may, in use, be removably connected to the host device, although in other applications the driver apparatus may be used to drive other transducers, e.g. haptic output transducers such as linear resonant actuators or the like. In the example of FIG. 1, the switching driver 101 is configured to be operable to drive the load in a bridge-tied-load (BTL)

configuration, and thus the load transducer 102 is connected, in use, between respective output nodes 103a and 103b of the switching driver 101 such that each side of the load can be driven with a respective drive signal that varies based on the input signal Sin, so as to generate a desired differential output signal across the load transducer 102. In some cases, however, the switching driver 101 could be configured to drive the load transducer 102 in a single-ended fashion, where only one side of the load is driven with a drive signal based on the input signal Sin and the other side of the load transducer 102 is held at a fixed DC voltage.

Stage 104 of the switching driver 101, which will be referred to herein as an output stage, comprises a network of switches 105 that can be controlled so as to switch the output nodes 103a and 103b between different switching voltages. It will be understood that FIG. 1 generally illustrates just a subset of switches of a possible switch network 105 and that there are various different arrangements of switches that could be implemented, depending on the application. For example, U.S. Pat. No. 11,277,128 and US2022/0376618 describe examples of switched mode drivers. A modulator 106 controls the operation of the switch network 105 so as to modulate each of the output nodes 103a and 103b between the relevant switching voltages with a controlled duty cycle so as to generate the respective drive signal for that output node based on the input signal Sin.

The switching driver 101 has first and second input nodes for receiving first and second supply voltages, VS1 and VS2, which may, for example, be a positive supply voltage and ground. For the avoidance of doubt, as used in this disclosure, the term supply voltage can include a ground voltage, i.e. 0V (zero volts) and references to receiving a supply voltage will cover receiving a defined ground voltage. The first and second supply voltages VS1 and VS2 define an input supply voltage Vsup (as the difference between the first and second supply voltages VS1 and VS2, e.g. Vsup=VS1−VS2).

In at least some embodiments of the present disclosure, the power stage 104 of the switching driver 101 also comprises at least one capacitive voltage generator for generating an additional voltage, which is different to the first and second supply voltages VS1 and VS2, and which can, in at least one operating mode of the switching driver, be used as a switching voltage by the switching driver, i.e. by the power stage 104.

A capacitive voltage generator receives input voltages, such as the first and second supply voltages VS1 and VS2 (and/or, in some cases, a voltage output from another capacitive voltage generator), and is operable so that at least one flying capacitor (not separately illustrated in FIG. 1) can be connected, in a charging state, to be charged by the input voltages for that capacitive voltage generator, and can then be connected, in an output state, with one of the input voltages to provide an output voltage which is level-shifted from that input voltage.

In the example of FIG. 1, a first capacitive voltage generator 106-1 receives the first and second supply voltages and generates an output voltage VC1, which may, for example, correspond to the first supply voltage VS1 positively boosted by an amount equal the input supply voltage Vsup, and a second capacitive voltage generator 106-2 receives the first and second supply voltages and generates an output voltage VC2, which may for example correspond to the second supply voltage VS1 negatively boosted by an amount equal to the input supply voltage Vsup. In some cases, at least one of the capacitive voltage generators 106 may comprise a charge pump which operates, in use, with at least one hold or reservoir capacitor (not separately illustrated) at the output of the charge pump to maintain the output voltage of the charge pump. In such a case, the output voltage of the charge pump may be maintained in a substantially constant manner when the charge pump is active, with only a certain voltage ripple due to the switching cycle of the charge pump—and the switching cycle of the charge pump may be independent of the switching cycle of the modulation of the output nodes 103a and 103b. In some cases, however, the capacitive voltage generator may not operate with a hold capacitor and may generate the relevant output voltage for only part of the switching cycle as required for modulation of the output nodes.

In the example of FIG. 1, the switching driver 101 is a multi-level switching driver which is operable so that switching voltages which the output nodes 103a and 103b are switched between can be selectively varied in use. The switching voltages may be selected from the first and second supply voltages VS1 or VS2 and the generated voltages VC1 and VC2.

Purely by way of example, consider that the first supply voltage VS1 is a positive supply voltage, VP, and the second supply voltage is ground, i.e. 0V, and the input supply voltage, Vsup, defined by the difference between VS1 and VS2, is thus equal to VP. If the output voltage VC1 of the first capacitive voltage generator 106-1 is equal to the first supply voltage positively boosted by the input voltage, the output voltage from the first capacitive voltage generator 106-1 will be equal to 2VP. If the output voltage VC2 of the second capacitive voltage generator 106-2 is equal to the second supply voltage negatively boosted by the input voltage, the output voltage from the second capacitive voltage generator 106-2 will be equal to −VP. In this example, the switching voltages can thus be selected from any of +2VP, +VP, 0V or −VP.

The switching driver 101 may be operable in a variety of different operating modes where the switching voltages are different in the different mode. For example, the switching driver 101 could be operated in a first mode, which can be seen as a low signal level mode, in which both output nodes 103a and 103b are modulated between the first and second supply voltages, VP and ground, to generate a differential output signal, of either polarity, with a magnitude (on average over the course of the switching cycle) of up to VP (or near VP accounting for losses and practically achievable pulse widths). The switching driver 101 could also be operated in a second mode, which can be seen as an intermediate signal level mode, in which a one of the driver output nodes 103a or 103b (depending on the required polarity of the output signal) is modulated between the boosted voltage +2VP and the first supply voltage VP, whilst the other driver output node is modulated between the first and second supply voltages, VP and ground, to generate a differential output signal across the load of a magnitude up to 2VP or near 2VP. In an alternative second mode, the same output range could be generated by instead switching one driver output node between the first and second supply voltages VP and ground, whilst switching the other output node between ground and the boosted voltage −VP. A third mode, which can be seen as a high signal level mode, may involve one driver output node (depending on the required polarity of the output signal) being modulated between the boosted voltage +2VP and the first supply voltage VP, whilst the other driver output node is modulated between the ground and the boosted voltage −VP, to generate a differential output signal across the load of a magnitude up to 3VP or near 3VP.

The switching voltages are different in the different modes, in that at least one of the switching voltages for at least one of the driver output nodes is different in each different mode. It will be understood that some switching voltages for the driver output nodes may be the same in different modes, e.g. the first and second modes in the example above both use VP and ground as switching voltages for one driver output node, however the other node is switched between VP and ground in the first mode and between 2VP and VP in the second mode. As used herein, a reference to different modes using different switching voltages shall thus mean that the set of switching voltages used in the different modes is not the same, but there may be some switching voltages in common in some cases.

It should be noted that whilst the capacitive voltage generator(s) may be used for voltage boosting or step-up operation, i.e. to provide level shifting of a voltage to provide a voltage of a higher magnitude (whether positive boosting or negative boosting), in some applications at least one capacitive voltage generator may be configured to provide a voltage of a lower magnitude, e.g. to provide a buck or step-down operation which may provide a voltage with a magnitude which is a fraction of that of the input voltage.

The modulator 106 is thus configured to control the mode of operation of the power stage 104 of the switching driver and also a duty cycle of modulation of the driver output nodes in the relevant mode, which in some cases may involve control over at least one of the capacitive voltage generators 106, e.g. to enable or disable the capacitive voltage generator and/or control a duty-cycle or switching frequency.

Typically, the duty cycles for the output nodes are determined by a suitable quantizer or similar controller of the modulator 106. In some cases, the input signal Sin received by the modulator 106 may simply be supplied as an input signal Smod for a quantizer, but in some implementations there may be at least some filtering applied to provide a quantizer input signal Smod. In closed-loop operation of the switching driver 101, a feedback signal may be combined with the input signal, with some filtering, to provide the quantizer input signal Smod.

Figure 2:
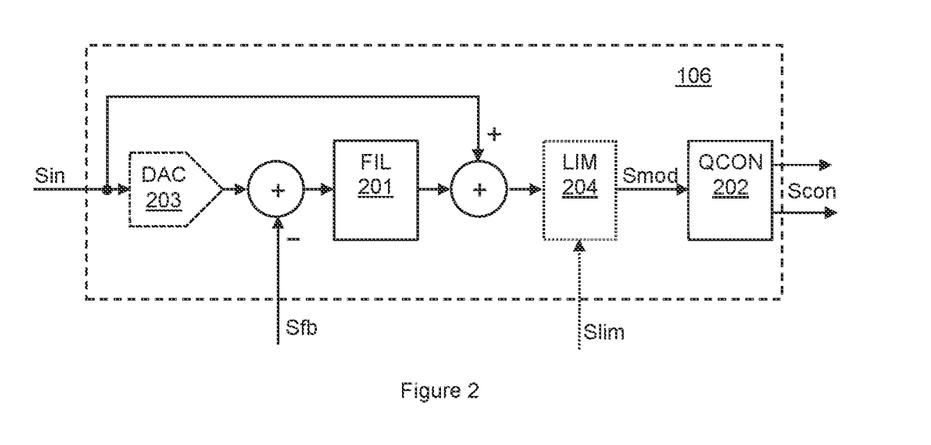
FIG. 2 illustrates one example of a modulator for a switching driver.

FIG. 2 illustrates one example of a modulator 106, which in this example may be operable in a closed-loop manner. The input signal Sin received by the modulator 106 is combined with a feedback signal Sfb, e.g. by subtraction to form an error signal, and then filtered by a loop filter 201. The feedback signal Sfb may, in at least some implementations, be a feedback signal indicative of the output voltage Vout across the load transducer 102. In some implementations, the filtered output of the loop filter 201 may be combined with a feedforward version of the input signal Sin to provide the signal Smod for input to a quantizer controller 202. The quantizer controller 202 may be configured, for a multi-level switching driver 101 such as discussed with reference to FIG. 1, to determine the relevant mode of operation and to control the switch network 105 and capacitive voltage generators 106 accordingly, including generating suitable switch control signals, e.g. suitable PWM signals, to control the duty-cycles of the relevant switches to modulate the output nodes between the relevant switching voltages with the required duty-cycle. For example, the quantizer controller 202 may compare the modulator signal Smod, i.e. the quantizer input signal, to one or more thresholds to determine an operating mode and, for the relevant mode, compare the compare the modulator signal Smod to at least one appropriate ramp waveform to generate the suitable PWM switch control signals for the relevant switches that are duty-cycled in that mode.

In some cases, the feedback signal Sfb may be received as a digital signal, e.g. from an analog-to-digital converter (ADC) in the feedback path, and thus the feedback signal may be combined digitally with the input signal and the loop filter 201 may be a digital filter. In some cases, however, the feedback signal may be an analog feedback signal and thus may be combined with an analog version input signal Sin. The modulator may thus comprise a digital-to-analogue converter DAC 203 for converting the input signal to analog. In some cases, the loop filter 201 could be an analog filter and the output of the loop filter could be combined with a feedforward version of the analog input signal so as to provide an analog quantizer input signal Smod for the quantizer controller 202. In some cases, however, as illustrated in FIG. 2, the filter 201 may be a hybrid filter that receives an analog input and provides a digital output. This allows the digital input signal Sin to be fed-forward and combined digitally with the output of the loop filter 201, which provides a digital quantizer input signal Smod to the quantizer/controller 202, which can be advantageous for some of the embodiments discussed below.

In all these cases, the quantizer input signal Smod may effectively encode the voltage demand of the power stage 104 of the switching driver 101—from which the quantizer controller 202 determines the mode of operation for a multi-level converter and the relevant duty-cycle.

Referring back to FIG. 1, the driver apparatus 100 also comprises a current monitor 107 for monitoring, in this example, input current of the switching driver 101. In the example of FIG. 1, the current monitor 107 may determine the input current $I_{IN}$ from an indication of the output current $I_{OUT}$ of the switching driver 101 and also the modulator signal Smod.

As one skilled in the art will understand, in general, the efficiency eff of the switching driver (in terms of power efficiency) can be expressed as:

$$eff = Rload/(Rout + Rload) \qquad \text{Eqn. (1)}$$

where Rload is the load resistance and Rout is the effective output resistance of the switching driver. This can be rewritten as:

$$Rout = (Rload/eff) - Rload = (1/eff - 1) \times Rload \qquad \text{Eqn. (2)}$$

It is noted that for a switching driver 101 such as discussed with reference to FIG. 1, the output voltage Vout, i.e. the differential voltage across the load transducer 102 over the course of a switching cycle, depends on the switching voltages which the output nodes switch between and also the relevant duty cycles. The switching voltages which the output nodes switch between are defined by, or generated from, the input supply voltage Vsup and thus there is a dependence of the output voltage Vout on the input supply voltage Vsup. The duty-cycles of the output nodes are, as discussed with reference to FIG. 2, determined by the quantizer controller 202 based on the quantizer input signal Smod. The quantizer input signal Smod effectively encodes the voltage demand of the switching driver 101, from which the quantizer/controller 202 determines the mode of operation for a multi-level converter and the relevant duty-cycle.

For the example discussed above, where the supply voltages VS1 and VS2 are VP and ground respectively, so that the input supply voltage Vsup=VP, and boosted voltages of +2VP and −VP are generated with the power stage being operable in three different modes to generate an output in the range of +3VP to −3VP, the output voltage will be proportional to the product of Vsup (in this case equal to VP) and Smod (where Smod has a value in the range of +3 to −3). In this case, the effective output resistance of the switching driver can be given by:

$$Rout = (((Smod \times Vsup)/\text{Sin}) - 1) \times Rload \qquad \text{Eqn. (3)}$$

where Sin is the input signal to the modulator (and represents the voltage demand of the input signal).

From equations 2 and 3, this implies that:

$$1/\text{eff} = (Smod \times Vsup)/\text{Sin} \qquad \text{Eqn. (4)}$$

Based on the input power and output power and the efficiency eff discussed above, then, in terms of the input current $I_{IN}$ from the power supply to the switching driver and the output current $I_{OUT}$ to the load:

$$Vsup \times I_{IN} = (Vout \times I_{OUT})/\text{eff} \qquad \text{Eqn. (5)}$$

Assuming that, if the switching driver is not clipped then Vout is equal to the demanded voltage Sin, then:

$$Vsup \times I_{IN} = \text{Sin} \times I_{OUT} \times ((Smod \times Vsup)/\text{Sin}) \qquad \text{Eqn (6)}$$

and thus:

$$I_{IN} = I_{OUT} \times Smod \qquad \text{Eqn (7)}$$

It can therefore be seen that the input current $I_{IN}$ can be determined as the product of the output current $I_{OUT}$ and the modulator signal Smod which is the input to the quantizer controller 202.

The current monitor 107 thus receives a first current signal which is indicative of a sensed first driver current, which, in the example of FIG. 1, is an indication Simon of the sensed output current $I_{OUT}$ and an indication of the modulator signal Smod for the purposes of monitoring the input current $I_{IN}$.

The output current $I_{OUT}$ may be measured or sensed by current sensing circuitry 108. It will be noted that, in many conventional implementations of a switching driver, it may generally be desirable to monitor the output current and current sensing circuitry 108 may thus typically be present in a conventional switching driver circuit. The current sensing circuitry 108 may therefore be shared with other control functions and may not represent any additional circuit overhead in terms of area or bill of materials for the current monitor 107. The current sensing circuitry 108 may comprise an ADC for sensing a voltage across a sense resistor (not separately illustrated), although other current sensing arrangements may be implemented as will be understood by one skilled in the art.

In some implementations, the current monitor 107 may determine a value indicative of a second driver current, in this case the input current $I_{IN}$, and output a second current signal $SI_{IN}$ which is indicative of the determined input current $I_{IN}$, e.g. for use by some other monitoring or control circuitry. Additionally or alternatively, the current monitor 107 may control current limiting according to one or more limits for the input current and may generate a control signal Slim for controlling current limiting.

From equation 7 it will be noted that, as the input current has a dependence on the modulator signal Smod, a current limit value $I_{LIMIT}$ for the input current $I_{IN}$ could be enforced by setting a limit Smodmax for the modulator signal equal to:

$$Smodmax = I_{LIMIT}/I_{OUT} \qquad \text{Eqn (8)}$$

Thus, in some implementations, limiting may be applied within the modulator and, as illustrated in FIG. 2, the driver apparatus may comprise a limiter 204 which is configured to apply a limit to modulator signal Smod to implement current limiting. This limit, Smodmax, of the modulator signal is thus effectively a limit of duty cycle for the switching driver (for a relevant driver mode of operation for multi-level drivers) that depends on a defined current limit value $I_{LIMIT}$ and the sensed output current $I_{OUT}$.

The embodiment of FIG. 1 thus implements current monitoring that can provide an indication of input current and/or can implement current limiting without requiring an AFE and ADC for sensing current in the input path, and which instead can make use of the output current monitoring circuitry which may, in any case, be present. This can provide significant savings in circuit area and bill of materials with associated benefits of reduced costs and smaller overall circuit size.

Also noted above, for switching drivers, e.g. switching drivers with capacitive voltage generation, there may be a variety of possible input paths for current, which may conventionally require the use of multiple sense resistors. Each sense resistor will result in some power dissipation, e.g. power loss, and the power loss for multiple input sense resistances may be greater than the power loss associated with a single output sense resistance (which may be present in any case) and thus the embodiment of FIG. 1 may have improved efficiency compared to conventional sensing in at least some applications.

As the input current is determined and/or limited based on the output current for a particular channel, the input current which is determined is explicitly the current for that channel, irrespective of whether any components are shared in a multi-channel arrangement. In addition, for switching drivers with multiple possible input current paths, only the current in the output path need be monitored.

When used for limiting, the limit can be applied as an effective limit of duty-cycle (in the relevant mode of operation). This means that limiting is applied only when the duty-cycle demand would otherwise exceed this limit and hence limiting is only applied when required and the signal is not unnecessarily attenuated.

Figure 3:
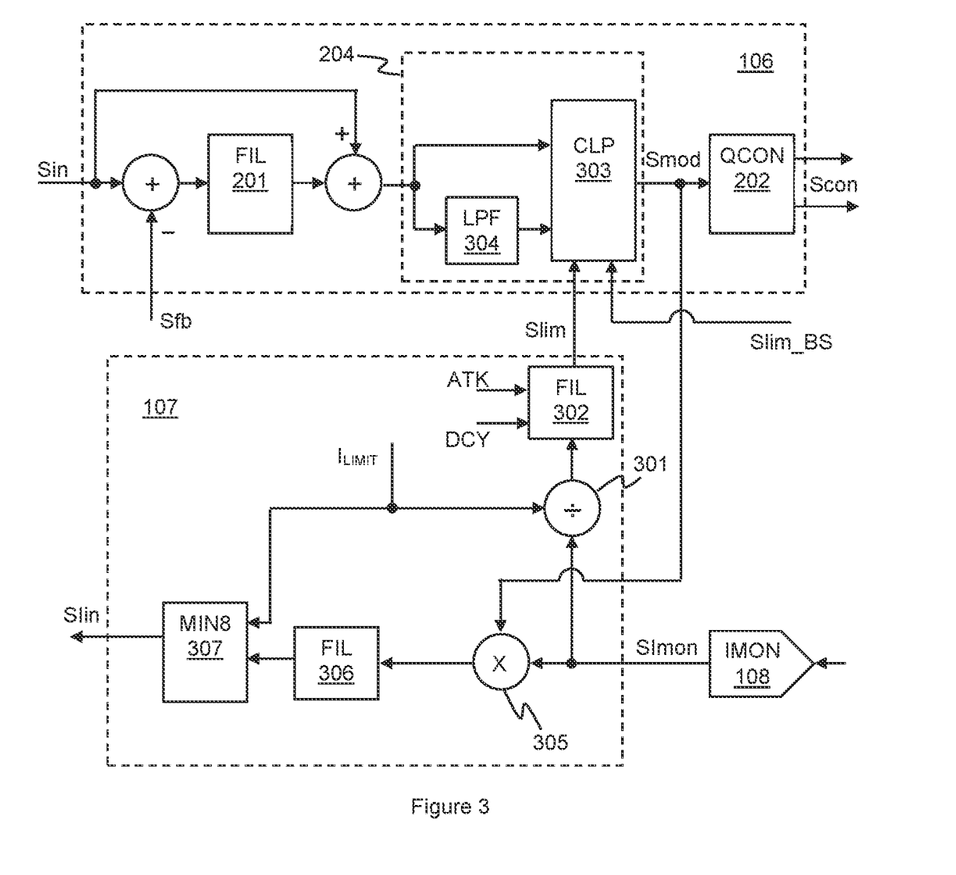
FIG. 3 illustrates one example of an example of a modulator and current monitor in more detail.

FIG. 3 illustrates one embodiment of a current monitor and modulator limiter in more detail, in which similar components as those discussed with reference to FIGS. 1 and 2 are identified by the same reference numerals.

FIG. 3 illustrates that the current monitor 107 comprises a divider 301 for dividing the input current limit value $I_{LIMIT}$ by the indication Simon of the sensed output current $I_{OUT}$ received from the current sensing circuit 108 to determine a limit value for the modulator signal, i.e. the quantizer input signal, to enforce the current limit. This limit value is then filtered by filter 302, which will be referred to herein as the limit filter, to provide the value of Smodmax which is provided, as limit control signal Slim, to the limiter 204.

The current limit $I_{LIMIT}$ may be a limit value which, in use, may be stored in a suitable register or the like and/or which may be retrieved from some memory. The current limit $I_{LIMIT}$ may be set, e.g. by the device manufacturer at the time of manufacture, although in some cases the current limit may be configurable in use and/or there may be a plurality of different current limits that may be applied in different use cases, e.g. in different device operating modes.

In the example of FIG. 3, the limiter 204 comprises a clipping block 303 for preventing the modulator signal Smod from exceeding the value of Smodmax indicated by the control signal Slim. In this example there are two paths into the clipping block 303 for the modulator signal, a first unfiltered path and a second path with low-pass filtering applied by low-pass filter 304 to remove high frequency noise. A controller of the clipping block 303 uses the filtered modulator signal from the low-pass filter 304 to determine whether to apply limiting (or clipping) or not. By using this filtered signal to determine when limiting/clipping is required, the limiter avoid repeatedly toggling between clipping and not-clipping behaviour that would be undesirable. If the clipping block determines that no clipping, i.e. no limiting, is required, then the unfiltered signal may be passed to the quantizer controller 202 as the quantizer input signal Smod. When the clipping block 303 determines that clipping is required, i.e. the filtered version of the modulator signal will exceed the relevant Smodmax value, then clipping is applied to limit the modulator signal Smod to the limit value.

As noted above, the value of Smodmax which is provided to the clipping block 303 is filtered by the limit filter 302. The limit filter 302 applies filtering so that the value of Smodmax used by the clipping block does not suffer from undue noise and/or from excess ringing due to filters that may be applied as part of the output current monitoring circuitry 108.

In some implementations, the filtering applied by the limit filter 302 may be adaptive or dynamic. In one example implementation, the limit filter 302 may be configured such that the filtered value of Smodmax can vary relatively quickly or aggressively as clipping or limiting is being approached but then is updated more gradually or smoothly once clipping or limiting is being applied. In other words, the modulator signal limit may vary more quickly with changes in Simon more quickly when limiting is not being applied to the quantizer input signal than when limiting is being applied. This may be implemented by having variable update rates to provide fast or slow updating, with, in general, slower updating being applied whilst clipping is being applied. This can help avoid unwanted oscillation that might otherwise occur due to changes in the limit of Smodmax resulting in a change in the output voltage and a resulting change in output current $I_{OUT}$ feeding back to a change in duty-cycle limit. In some implementations, the operation of the limit filter 302 may vary depending on the extent of change in the value of Smodmax determined from the $I_{LIMIT}/I_{OUT}$ calculation.

In one implementation, the limit filter 302 may be implemented to use a fast attack if the variation in determined target value of Smodmax input to the limit filter 302 (i.e. the difference between the presently calculated target value and the previously determined value) is above a defined fast attack threshold. The variable updating rates may be implemented by updating the output value of Smodmax to be a weighted sum of the present value and the target value with respective complementary weightings, e.g. equal to the new input target value (i.e. the output from the divider 301) multiplied by a factor P summed with the previous output value multiplied by a factor (1−P), where P can have a value in the range from 0 to 1. The variable update speed can be implemented by varying the respective weightings, i.e. the factor P. The limit filter 302 may also have a decay rate, which may be slower than the fast attack rate but which may be faster than the slow attack rate. The various attack and decay rates and thresholds, ATK and DCY, may be configurable, e.g. programmable.

The current monitor 107 of FIG. 3 is also arranged to provide an output Slin indicative of the input current $I_{IN}$. A multiplier 305 is thus configured to multiply the indication Simon of the output current $I_{OUT}$ with the modulator input signal Smod to determine an indication of the input current $I_{IN}$ which, in the example of FIG. 3 is filtered by filter 306, e.g. low pass filtered to remove high frequency noise, to provide the output Slin indicative of the input current $I_{IN}$.

For switching drivers with capacitive voltages generation, e.g. using capacitive voltage generators 106 such as discussed with reference to FIG. 1, one issue that may impact the accuracy of the current monitoring is that, in some operating conditions, some of the output current will be provided by the capacitors of the capacitive voltage generators. Over time, the capacitors will be recharged by the input current and thus the steady state performance of the current monitor 107 will be good and may typically be dominated by any error in the current sensing circuitry 108. However, for short-term transients in the input signal, and hence the output voltage, the contribution of the capacitors to the output current may be more of an issue, particularly for relatively high frequency signal components where the peak of the output signal may draw a relatively significant contribution to the output current from the capacitor(s). In such a case, the relationship between the output current $I_{OUT}$ and the input current $I_{IN}$ discussed above may vary during the transient as the capacitor(s) provide the contribution to the output current $I_{OUT}$. As such, during such transients, the determined indication of the input current $I_{IN}$ may be higher than the actual input current.

In the example of FIG. 3, the current monitor 107 is configured to avoid an over-estimation of input current by limiting the indication Slin of input current to be no greater than the current limit $I_{LIMIT}$. In essence, it is assumed that the current limiting acts correctly to limit the input current to be no greater than the current limit $I_{LIMIT}$ and thus the current monitor 107 limits the output value of Slin so as not to be greater than the current limit $I_{LIMIT}$. In the example of FIG. 3, a minimum function block 307 may thus output the lower of the determined value of input current and the current limit $I_{LIMIT}$ as the indication Slin of the monitored input current. In some cases, the minimum function block may be configured to take account of an expected time delay between the modulator input signal reaching the determined limit for clipping or signal limiting to be applied and the input current reaching the current limit $I_{LIMIT}$. This delay could, for instance, be determined based on knowledge of the capacitance of the capacitor(s) of the capacitive voltage generator(s).

The approach of limiting the indication Slin of the input current $I_{IN}$ so as to not exceed the current limit $I_{LIMIT}$ provides a relatively simple and straightforward way of avoiding an unwanted over-estimation of the input current $I_{IN}$. In some implementations, however, the voltage of the relevant capacitors that contribute some of the output current may be monitored so as to determine the energy transferred to the load, which may allow an appropriate correction to be applied to the determined value of input current $I_{IN}$. In some cases, the relevant capacitor voltages may be monitored or otherwise known for other reasons and thus this may not require any additional monitoring circuitry.

Figure 4:
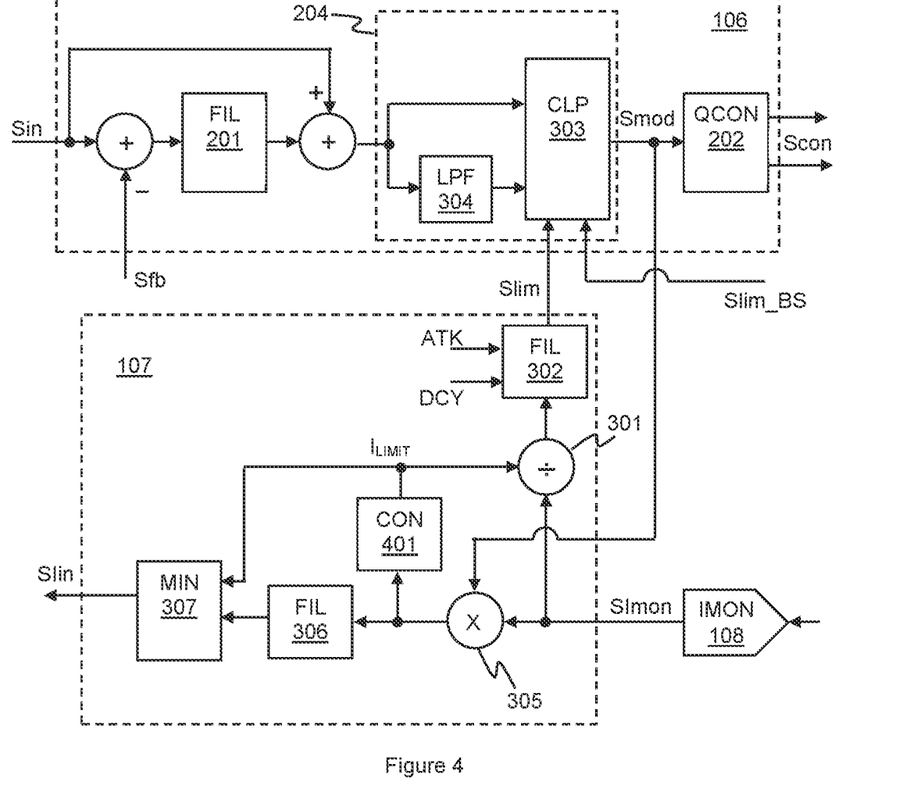
FIG. 4 illustrates another example of an example of a modulator and current monitor in more detail.

The embodiment of FIG. 3 uses a defined current limit $I_{LIMIT}$, which may be fixed or static for a particular use case (i.e. which doesn't change in use) and which may be stored in a register or the like. In some embodiments, however, the current limit $I_{LIMIT}$ may be dynamically adjusted in use based on one or more environmental or operating parameters, for instance based on a monitored battery voltage. In some cases the determined value of input current $I_{IN}$ may be taken into account, for instance a relatively high current may be allowed for a certain duration, but if the high current persists the current limit may be reduced. FIG. 4 illustrates an embodiment in which similar components to those discussed previously are identified by the same reference numerals and in which a limit controller 401 is configured to receive the output from multiplier 305 indicative of the product of $I_{OUT}$ and Smod. The limit controller 401 may be implemented as a transient current controller. As the limiter 204 is part of the modulator control loop, the limit controller 401 may operate at a relatively high rate to provide high resolution temporal current limiting.

The embodiments described above thus allow the input current $I_{IN}$ to be determined or inferred based on an indication of the sensed output current $I_{OUT}$ and the modulator input signal Smod. It will be noted, however, that the same approach could instead be used to determine or infer the output current $I_{OUT}$ from a sensed value of the input current $I_{IN}$.

Rearranging equation 7 it can be seen that:

$$I_{OUT} = I_{IN}/Smod \qquad \text{Eqn (9)}$$

and that for a limit of output current, $I_{OUTLIM}$, a maximum value of modulator input signal Smodmax can be defined as:

$$Smodmax = I_{IN}/I_{OUTLIM} \qquad \text{Eqn. (10)}$$

Figure 5:
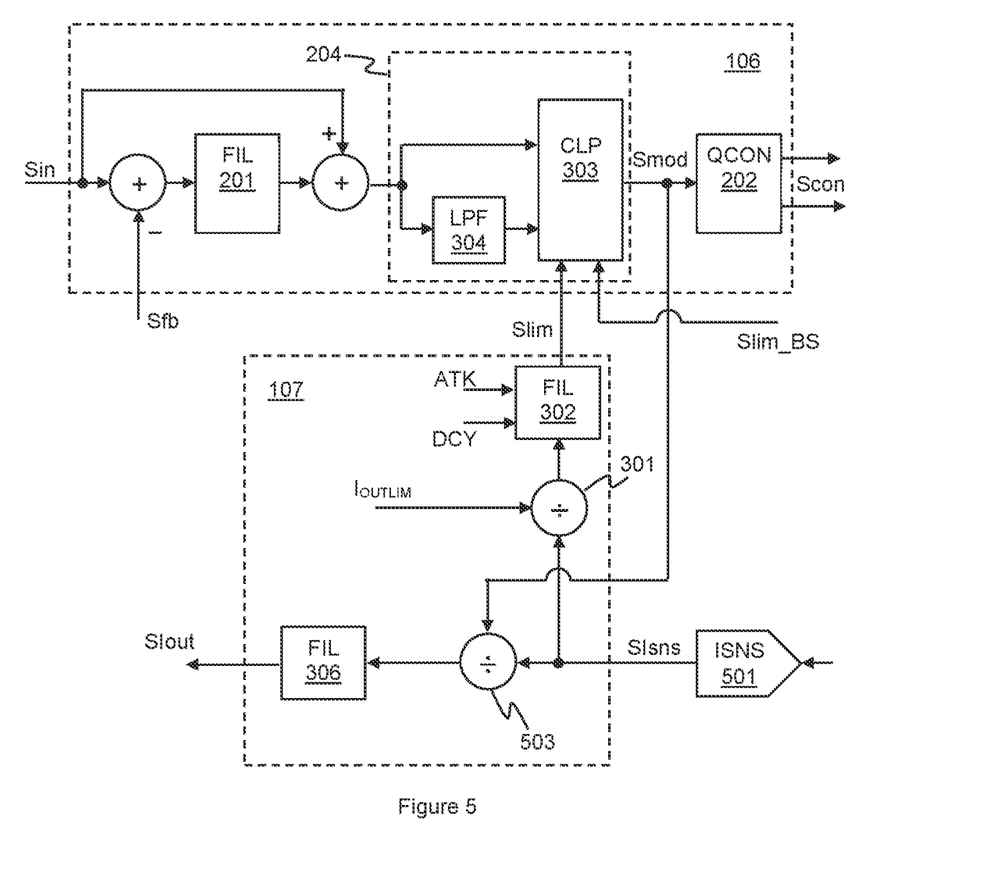
FIG. 5 illustrates an example of a modulator and current monitor for output current monitoring and/or limiting.

Thus, if the value of the input current $I_{IN}$ were sensed, it would be possible to determine and/or limit the output current $I_{OUT}$ based on the sensed input current. Whilst this would require some current sensing circuitry for sensing the input current, it may avoid the need for current sensing circuitry for sensing the output current $I_{OUT}$ and may thus offer some savings in circuit area/bill of materials. FIG. 5 illustrates one example of an embodiment for determining and limiting the output current $I_{OUT}$ in which similar components to those discussed previously are identified by the same reference numerals.

In the example of FIG. 5, current sensing circuitry 501 monitors the input current to the switching driver and provides an indication Isns of the input current. In this example divider 301 is configured to divide the indication Isns of input current by the relevant current limit $I_{OUTLIM}$ which may be a static limit or which may be controlled by a limit controller in a similar manner as discussed with reference to FIG. 4. The resultant value of Smodmax can be filtered and used to set a limit for clipping block 303 in a similar manner as discussed for FIGS. 3 and 4.

To provide the indication, Slout, of output current, divider 503 is configured to divide the indication Isns of input current by the modulator input signal Smod, and the output of the divider may be filtered by filter 306 to remove any high-frequency noise.

As described above, in some cases at least some output current may be contributed by the capacitors of the capacitive voltage generators, for instance in response to transients in the input signal. Thus, whilst the steady state performance may be good, in the presence of transients, the indication, Slout, of output current based on the monitored input current Isns, may under-represent the actual output current. As discussed above in some implementations, the voltage of the relevant capacitors that contribute some of the output current may be monitored so as to determine the energy transferred to the load, which may allow an appropriate correction to applied to the determined value of output current Slout.

It will also be understood that to estimate the output current for a given channel the input current for that particular channel should be monitored.

The embodiments discussed herein thus receive a first current signal indicative of a sensed first driver current, which may be the output current or the input current, to determine a value for and/or apply limiting to a second driver current, which is the other of the output current or the input current. The embodiments also use a modulator signal from the modulator of the switching driver. For current limiting, the embodiments may apply limiting to the modulator signal, and may determine a modulator signal limit as a function of the sensed current signal and defined current limit. For determining the value of the current, the current monitor may determine the value as a function of the sensed current signal and the modulator signal. The modulator signal may be the input to a quantizer controller of the modulator. This modulator signal can be indicative of the duty-cycle demand of the switching driver and, for a switching driver operable in different modes with different switching voltages, and indication of the mode of operation of the switching driver.

The examples described above with reference to the figures envisage enforcing one or more limits by setting limits for the modulator signal within the modulator. However other methods/components for limiting the input signal to enforce current limiting could be used in other implementations, e.g. using an upstream datapath compressor or the like, possibly using the determined value of the relevant current.

The examples above have been discussed in the context of driving a transducer, which may in particular be an audio transducer, and embodiments of the present disclosure may advantageously be used in audio application or other applications for driving a transducer, e.g. such as haptic output transducer. However, the current monitoring and/or limiting may be applied to any application in which a switching driver is used to output an output voltage to a load based on an input signal, in particular a switching driver in which at least one voltage that may be used as a switching voltage is generated by a capacitive voltage generator.

The driver apparatus of embodiments of the disclosure may be suitable for driving an output transducer. The output transducer may be, in some implementations, be an audio output transducer such as a loudspeaker or the like. The output transducer may be a haptic output transducer. In some implementation the output transducer may be driven in series with an inductor, i.e. there may be an inductor in an output path between an output node of the switching driver and the load. In some implementations the transducer may be a piezoelectric or ceramic transducer.

Embodiments may be implemented as an integrated circuit. Embodiments may be implemented in a host device, especially a portable and/or battery powered host device such as a mobile computing device for example a laptop, notebook or tablet computer, or a mobile communication device such as a mobile telephone, for example a smartphone. The device could be a wearable device such as a smartwatch. The host device could be a games console, a remote-control device, a home automation controller or a domestic appliance, a toy, a machine such as a robot, an audio player, a video player. It will be understood that embodiments may be implemented as part of a system provided in a home appliance or in a vehicle or interactive display. There is further provided a host device incorporating the above-described embodiments.

The skilled person will recognise that some aspects of the above-described apparatus and methods, for instance for setting of limits or implementing clipping control, may be embodied as processor control code, for example on a non-volatile carrier medium such as a disk, CD- or DVD-ROM, programmed memory such as read only memory (Firmware), or on a data carrier such as an optical or electrical signal carrier. For some applications, embodiments may be implemented on a DSP (Digital Signal Processor), ASIC (Application Specific Integrated Circuit) or FPGA (Field Programmable Gate Array). Thus, the code may comprise conventional program code or microcode or, for example code for setting up or controlling an ASIC or FPGA. The code may also comprise code for dynamically configuring re-configurable apparatus such as re-programmable logic gate arrays. Similarly, the code may comprise code for a hardware description language such as Verilog™ or VHDL (Very high-speed integrated circuit Hardware Description Language). As the skilled person will appreciate, the code may be distributed between a plurality of coupled components in communication with one another. Where appropriate, the embodiments may also be implemented using code running on a field-(re)programmable analogue array or similar device in order to configure analogue hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. A driver apparatus for driving a load with an output signal based on an input signal comprising:
    a switching driver comprising:
        an output stage having a network of switches for switching at least a first output node between different switching voltages with a controlled duty-cycle to generate the output signal; and
        a modulator for controlling the duty-cycle of the output stage based on the input signal, wherein the modulator generates a modulator signal based on the input signal; and a current monitor configured to receive a first current signal indicative of a sensed first driver current and to determine and/or limit a second driver current using the first current signal and the modulator signal, wherein one of the first driver current and the second driver current is an output current to the load and the other of the first driver current and the second driver current is an input current from a power supply.

2. The driver apparatus of claim 1 wherein the modulator comprises a quantizer controller configured to generate switch control signals for the network of switches of the output stage, wherein the quantizer controller is configured to receive a quantizer input signal based on the input signal combined with a feedback signal indicative of the output signal and wherein the quantizer input signal is said modulator signal.

3. The driver apparatus of claim 2 wherein the switching driver is operable in a plurality of different driver modes, wherein the switching voltages are different in the different driver modes, and wherein the quantizer is configured to generate the switch control signals for the network of switches of the output stage to also control the driver mode based on the quantizer input signal.

4. The driver apparatus of claim 2 wherein the current monitor is configured to limit the second driver current to not exceed a current limit value.

5. The driver apparatus of claim 4 comprising a limiter for limiting the quantizer input signal to not exceed a modulator signal limit wherein the current monitor is configured to generate the modulator signal limit as a function of the first current signal and the current limit value.

6. The driver apparatus of claim 5 wherein the limiter comprises a limiter controller for determining when to apply limiting to the quantizer input signal, wherein the limiter controller is configured to determine when to apply limiting based on filtered version of the quantizer input signal.

7. The driver apparatus of claim 5 wherein the first driver current is the output current to the load and the second driver current is the input current from a power supply and the current monitor is configured to generate the modulator signal limit by dividing the current limit value by the first current signal.

8. The driver apparatus of claim 7 wherein the current monitor is configured such that the modulator signal limit varies with changes in the first current signal more quickly when limiting is not being applied to the quantizer input signal than when limiting is being applied.

9. The driver apparatus of claim 7 wherein the current monitor is configured to determine a target value of the modulator signal limit based on the first current signal and to update a present value of the modulator signal limit to a new value of the modulator signal limit as a weighted sum of the present value and the target value with respective complementary weightings, and wherein the current monitor is configured to vary the respective complementary weightings based on a difference between the target value of the modulator signal limit and a previously determined target value of the modulator signal limit.

10. The driver apparatus of claim 5 wherein the first driver current is the input current from a power supply and the second driver current is the output current to the load and the current monitor is configured to generate the modulator signal limit by dividing the first current signal by the current limit value.

11. The driver apparatus of claim 5 wherein the current monitor is configured to controllably vary the current limit value to apply transient current control.

12. The driver apparatus of claim 1 wherein the current monitor is configured to determine a value indicative of the second driver current and to output the determined value indicative of the second driver current as a second current signal.

13. The driver apparatus of claim 12 wherein the first driver current is the output current to the load and the second driver current is the input current from a power supply and the current monitor is configured to determine the value indicative of the second driver current by multiplying the first current signal by the modulator signal.

14. The driver apparatus of claim 12 wherein the current monitor is further configured to limit the second driver current to not exceed a current limit value by limiting the modulator signal to not exceed a modulator signal limit that is generated as a function of the first current signal and the current limit value.

15. The driver apparatus of claim 14 wherein the current monitor is configured to output the current limit value as the value of the second current signal when limiting is being applied to the internal modulator signal.

16. The driver apparatus of claim 12 wherein the first driver current is the input current from a power supply and the second driver current is the output current to the load and the current monitor is configured to determine the value indicative of the second driver current by dividing the first current signal by the modulator signal.

17. The driver apparatus of claim 1 wherein the switching driver comprises at least one capacitive voltage generator for generating at least one voltage that can be used as a switching voltage.

18. The driver apparatus of claim 1 wherein the driver apparatus is an audio driving apparatus for driving an audio transducer with an audio output signal.

19. A driver apparatus for driving a load with an output signal based on an input signal comprising:
a switching driver comprising an output stage for switching at least a first output node between different switching voltages with a controlled duty-cycle to generate said output signal and a modulator for controlling the duty-cycle of the output stage based on the input signal; and
a current monitor configured to receive an indication of a sensed first current and to determine at least one of:
an indication of a value of a second current, wherein the indication of the value of the second current is determined as a function of the indication of the sensed first switching driver current and a modulator signal received from the modulator; and
a modulator signal limit for limiting the modulator signal so as to apply current limiting of the second current, wherein the modulator signal limit is determined as a function of the indication of the sensed first current and a current limit value;
wherein one of the first and second currents is an output current from the output stage to the load and the other of the first and second currents is an input current to the switching driver from a power supply.

20. A driver apparatus for driving a load with an output signal based on an input signal comprising:
a switching driver comprising:
an output stage having a network of switches for switching at least a first output node between different switching voltages with a controlled duty-cycle to generate said output signal; and
a modulator for generating switch control signals for controlling the network of switches to control the duty-cycle of the switching output stage, wherein the modulator comprises a filter arrangement configured to generate a modulator signal based on the input signal and a feedback signal of the output voltage and a quantizer configured to generate the switch controls signals based on the modulator signal; and a current limiter for limiting an input current of the switching driver not to exceed an input current limit, wherein the current limiter is configured to generate a modulator signal limit as a function of the current limit value and a received signal of a sensed output current and to limit the modulator signal not to exceed the modulator signal limit.

* * * * *